United States Patent [19]

Uriya

[11] Patent Number: 5,408,201
[45] Date of Patent: Apr. 18, 1995

[54] FREQUENCY SYNTHESIZER USING THREE SUBFREQUENCY SYNTHESIZERS FOR GENERATING TWO DIFFERENT FREQUENCIES

[75] Inventor: Susumu Uriya, Tokyo, Japan

[73] Assignee: NEC Corporation, Japan

[21] Appl. No.: 247,080

[22] Filed: May 20, 1994

[30] Foreign Application Priority Data

May 24, 1993 [JP] Japan .................. 5-144288

[51] Int. Cl.⁶ .................. H03L 7/07; H03L 7/18; H03L 7/22
[52] U.S. Cl. .................. 331/2; 331/25; 331/31; 331/38; 331/40; 331/41; 331/48; 331/56; 332/127; 455/76; 455/87; 455/260
[58] Field of Search .................. 331/2, 25, 31, 38, 40, 331/41, 42, 43, 48, 56; 455/76, 86, 87, 260; 375/120; 332/127

[56] References Cited

U.S. PATENT DOCUMENTS 2,987,680 6/1961 Israel .................. 331/2

FOREIGN PATENT DOCUMENTS 2014003A 8/1979 United Kingdom .
2107143A 4/1983 United Kingdom .

Primary Examiner—Siegfried H. Grimm
Attorney, Agent, or Firm—Whitham, Curtis, Whitham & McGinn

[57] ABSTRACT

A frequency synthesizer includes three subfrequency synthesizers: a first synthesizer generating a first subfrequency varying in units of a frequency step, a second synthesizer generating a second subfrequency varying in units of a frequency step being N times the first frequency step, and a third synthesizer generating a third subfrequency varying in units of the first frequency step. One output signal is obtained by mixing the first subfrequency and the second subfrequency. A second output signal is obtained by mixing the second subfrequency and the third subfrequency.

8 Claims, 7 Drawing Sheets

FREQUENCY SYNTHESIZER USING THREE SUBFREQUENCY SYNTHESIZERS FOR GENERATING TWO DIFFERENT FREQUENCIES

FIELD OF THE INVENTION

The present invention relates to a frequency synthesizer, and more particularly to a frequency synthesizer suitable for a digital radio transmitter and receiver such as a radio telephone apparatus using a plurality of channels of different frequencies.

BACKGROUND OF THE INVENTION

With the wide use of radio telephone systems, the shortage of radio waves to be allocated has become a serious problem, therefore making it indispensable to develop techniques for advantageously using radio waves. Several techniques have been proposed, for example, digitizing the radio equipment, using higher frequencies, and using a narrower bandwidth as a radio channel step.

As one example of prior art, FIG. 1 shows a schematic block diagram of a conventional transmission frequency synthesizer in digital radio telephone equipment.

A reference signal source 1 generates a reference signal of a frequency R times the channel step frequency $f_{CH}$, where R is an integer of one or more. A phase lock loop (PLL) synthesizer 2 generates a signal of a frequency $f_{LO}$ selected from channel frequencies in accordance with the channel designation data. This frequency is represented by $f_{LO}=f_0+M \cdot f_{CH}$, where $f_0$ is a base frequency corresponding to channel No. 0, and M is an integer within the range $0 < M < (m-1)$ according to the channel designation data, where m is the total number of channels.

A modulated signal source 3 outputs a periodic signal of a fixed frequency $f_M$. A modulator 4 modulates the periodic signal input from the modulated signal source 3 by using a modulating wave to be transmitted. A mixer 5 carries out frequency addition (or subtraction) of the signal of the frequency $f_{LO}$ input from the PLL synthesizer 2 and the signal of the fixed frequency $f_M$ input from the modulator 4 and outputs a signal of a frequency $f_{TX}$ as a transmission wave. For example, the frequency of the transmission wave of channel No. 0 is represented by the following expression:

$$f_{TX}=f_{LO}(=f_0+0 \cdot f_{CH})+f_M=f_0+f_M.$$

In the conventional frequency synthesizer shown in FIG. 1, since the output frequency $f_M$ of the modulated signal source 3 is fixed, selection of a transmission frequency from channel frequencies is made by changing the output frequency of the PLL synthesizer 2. Therefore, when the number of channels, m, is increased as much as possible in order to advantageously use the radio waves, it is necessary to use a higher frequency band as the transmission frequency $f_{TX}$ or to use a narrower bandwidth as a radio channel step. This makes the number of frequency divisions in the PLL synthesizer 2 undesirably large, resulting in much time to phase-lock a desired channel frequency.

Further, an apparatus in which a coarse resolution PLL loop is combined with a fine resolution PLL loop is disclosed in the U.S. Pat. No. 5,028,887 (lines 3 to 13 of the second column). However, this configuration is capable of providing a frequency step over only one broad frequency range, not two frequency ranges as necessary to a transmitter and receiver such as a radio telephone apparatus. If two frequency ranges are to be covered by this conventional apparatus, two PLL synthesizers must be provided for each of two frequency ranges, which undesirably contributes to increases in hardware and power consumption.

Furthermore, employing a digital direct synthesizer (DDS) in place of the PLL synthesizer 2, the circuit configuration is disadvantageously complicated resulting in increased power consumption.

SUMMARY OF THE INVENTION

An object of the present invention is to provide a frequency synthesizer capable of rapidly phase-locking two desired channel frequencies with a simple circuit and reduced power consumption.

In order to achieve the above described object, a frequency synthesizer according to the present invention is comprised of three subfrequency synthesizers: first synthesizer generating a first subfrequency varying in units of a first frequency step, second synthesizer generating a second subfrequency varying in units of a frequency step being N times the first frequency step, and third synthesizer generating a third subfrequency varying in units of the first frequency step. Two output signals are generated by using two combinations selected from the combinations of the first, second, and third subfrequencies. The two output signals have different frequencies belonging to two different frequency ranges, respectively.

More specifically, a first mixer mixes the first subfrequency and the second subfrequency to form one output signal. A second mixer mixes the second subfrequency and the third subfrequency to form the other output signal.

The first subfrequency is comprised of a first minimum frequency of the first synthesizer and a first variable frequency varying in units of the first frequency step.

The second subfrequency is comprised of a second minimum frequency of the second synthesizer and a second variable frequency varying in units of the frequency step being N times the first frequency step. The first minimum frequency and the second minimum frequency are added to make a minimum frequency of the first frequency range, and the first variable frequency and the second variable frequency are added to make the first frequency steps according to the first and second control signals (or channel designation data).

The third subfrequency is comprised of a third minimum frequency of the third synthesizer and a third variable frequency varying in units of the first frequency step. The second minimum frequency and the third minimum frequency are added to make a minimum frequency of the second frequency range, and the second variable frequency and the third variable frequency are added to make the first frequency steps according to the second and third control signals.

According to another aspect of the present invention, a frequency synthesizer is comprised of the first and second synthesizers and a constant subfrequency generator. One output signal is obtained by mixing the first and second subfrequencies. The other output signal is obtained by mixing the first and second subfrequencies and the constant subfrequency. While the two output frequencies can be changed in units of the first frequency step, the difference between the two output frequencies is constant.

DETAILED DESCRIPTION OF THE PREFERRED EMBODIMENTS

The invention will now be described with reference to the accompanying drawings.

Figure 2:
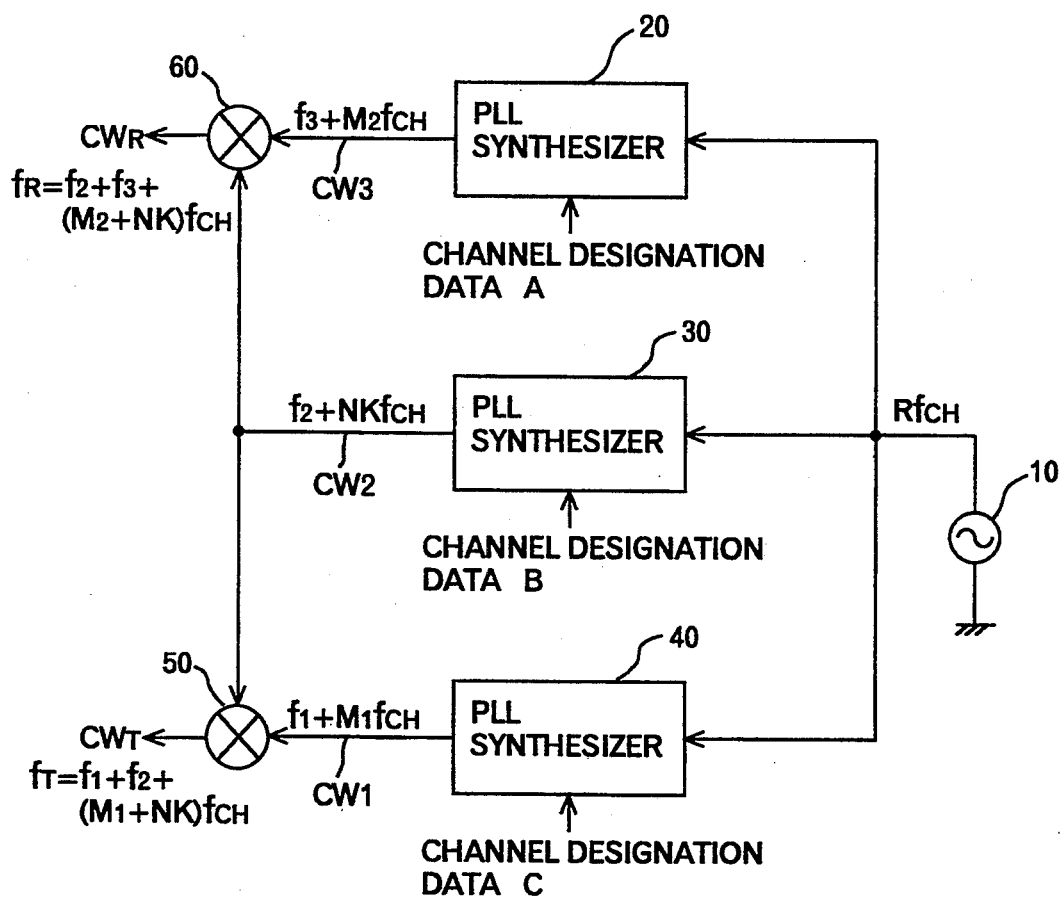
FIG. 2 is a schematic block diagram showing a first embodiment of a frequency synthesizer according to the present invention.

Referring to FIG. 2, a frequency synthesizer according to a first embodiment of the present invention is comprised of a reference signal source 10, PLL synthesizers 20 to 40, and mixers 50 and 60. The synthesizer generates two output signals, $CW_T$ and $CW_R$, of respective frequencies, $f_T$ and $f_R$, varying respectively within first and second frequency ranges. Each frequency range is comprised of m frequency bands (hereinafter referred to as channels). The output frequency $f_R$ varies in units of the frequency step size $f_{CH}$ in accordance with digital frequency control signals (or channel designation data) A and B, and on the other hand, the output frequency $f_T$ varies in units of the same step size in accordance with channel designation data B and C.

The reference signal source 10 generates a reference signal having a frequency R (integer) times as large as the channel step frequency $f_{CH}$ to output it to the respective PLL synthesizers 20 to 40. The PLL synthesizers 20, 30, and 40 generate signals CW3, CW2, and CW1, respectively, which are phase-locked in or phase-synchronous with the reference signal. These signals CW3, CW2, CW1 are frequency-controlled by the channel designation data A, B and C, respectively. Signals CW1 and CW2 are frequency-added (or -subtracted) by the mixer 50 to obtain a first output signal $CW_T$. Signals CW2 and CW3 are frequency-added (or -subtracted) by the mixer 60 to obtain a second output signal $CW_R$. The output signal $CW_T$ varies in frequency in units of a channel step frequency $f_{CH}$ according to the channel designation data B and C. Similarly, the output signal $CW_R$ varies in frequency in units of the same step size $f_{CH}$ according to the channel designation data A and B.

The PLL synthesizer 40 generates the signal CW1 of a frequency $f_1+M_1f_{CH}$ based on the channel designation data C, where $f_1$ is a minimum or base frequency in the synthesizer 40 and $M_1$ is an integer indicative of what number the relevant channel is. The minimum frequency $f_1$ and the channel number $M_1$ are determined by the channel designation data C.

The PLL synthesizer 30 generates the signal CW2 of a frequency $f_2+NKf_{CH}$ in accordance with the channel designation data B, where $f_2$ is a minimum frequency in the PLL synthesizer 30 and N and K are both integers. The minimum frequency $f_2$ and integers N and K are determined by the channel designation data B.

Figure 1:
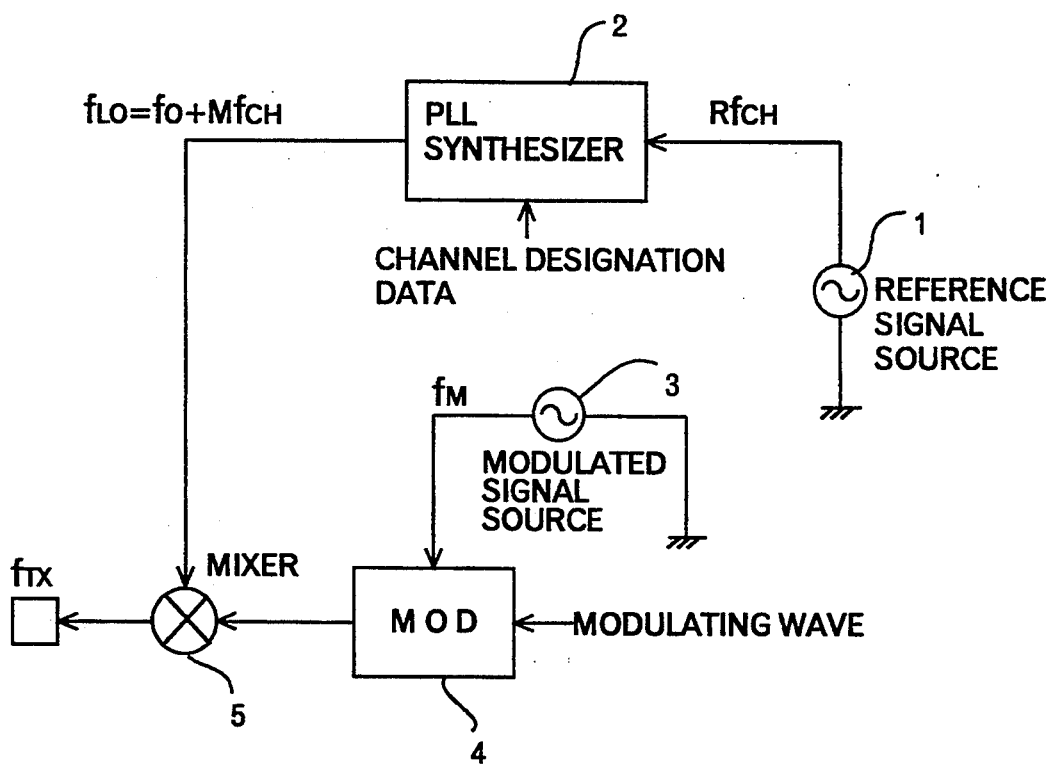
FIG. 1 is a block diagram of a conventional frequency synthesizer in a digital radio telephone apparatus.

The mixer 50 adds frequencies of output signals CW1 and CW2 of the PLL synthesizers 40 and 30 to obtain the output signal $CW_T$. Therefore, the output frequency $f_T$ of the output signal $CW_T$ can be represented by the following expression:

$$f_T = f_1 + f_2 + (M_1 + NK)f_{CH},$$

where $f_1+f_2$ is a minimum frequency in the first frequency range, which corresponds to the base frequency $f_0$ in the conventional example illustrated in FIG. 1. Respective integers of $M_1$, N, and K are specified by the channel designation data B and C such that the output frequency $f_T$ varies in units of a step frequency $f_{CH}$ ranging from the minimum frequency to the maximum in the first frequency range.

For further simplifying the above expression, let us assume that $K=M_1$. The output frequency $f_T$ can be represented by the following expression:

$$f_T = f_1 + f_2 + (1+N)M_1 f_{CH}.$$

Therefore, the output frequency $f_T$ can be similarly changed in units of a channel step frequency $f_{CH}$ by only designating N and $M_1$.

For example, assuming that $f_{CH}=25$ kHz, $f_1=775$ MHz and $f_2=145$ MHz, when it is desired to set the output frequency $f_T$ to 921.25 MHz, a designation, $M_1=2$ and $N=24$, shall be made by the channel designation data B and C. Then, the output frequency $f_T$ can be obtained from the following expression:

$$f_T = 775 + 145 + (1+24) \times 2 \times 0.025 = 921.25.$$

Further, where it is desired to set the output frequency $f_T$ to a frequency higher by one channel than the former, that is, $f_T=921.275$ MHz, if $M_1=1$ and $N=50$ are designated, then the desired output frequency represented by the following expression can be obtained:

$$f_T = 775 + 145 + (1+50) \times 1 \times 0.025 = 921.275.$$

Since the output frequency $f_1+M_1f_{CH}$ of the PLL synthesizer 40 is lower than the output frequency $f_{LO}$ of the conventional PLL synthesizer 2 (see FIG. 1), if the channel step frequency $f_{CH}$ is constant, the response time of the PLL synthesizer 40 becomes shorter than that of the conventional one. Further, since the frequency for phase comparison in the PLL synthesizer 30 is K times or $M_1$ times as large as the channel step $f_{CH}$, the time constant of the loop filter of the PLL can be decreased and the response time of the PLL can be shortened. The output frequency $f_T$ obtained by adding the frequencies of signals CW1 and CW2 respectively generated by PLL synthesizers 40 and 30 by the mixer 50 is therefore phase-locked in a short time.

Similarly, frequencies of signals CW2 and CW3 respectively generated by PLL synthesizers 30 and 20 are added by the mixer 60 to obtain the second output signal $CW_R$. The output frequency $f_R$ of the output signal $CW_R$ is also phase-locked rapidly. In this case, the output frequency $f_R$ is represented by the following expression:

$$f_R = f_2 + f_3 + (M_2 + NK)f_{CH}.$$

If K is equal to $M_2$, the output frequency $f_R$ can be obtained from the following simple expression:

$$f_R = f_2 + f_3 + (1+N)M_2 f_{CH}.$$

Herein, $f_2 + f_3$ corresponds to a minimum frequency in the second frequency range. $M_2$ is an integer indicative of what number the relevant channel is.

With such a configuration of the frequency synthesizer, integers $M_1$ and $N$ are designated by the channel designation data B and C, so that the output frequency $f_T$ of the output signal $CW_T$ within the first frequency range can be varied in units of the frequency step $f_{CH}$. Also, integers $M_2$ and $N$ are designated by the channel designation data A and B, so that the output frequency $f_R$ of the output signal $CW_R$ can be varied in units of the frequency step $f_{CH}$. In this case, if $M_1 = M_2$, two frequencies having the same number of channels in two different frequency ranges, respectively, can be obtained.

The above-mentioned PLL synthesizer is realized by a well-known technique such as the pulse swallowing method or a prescaler having two frequency division ratios controlled by a programmable counter.

Figure 3:
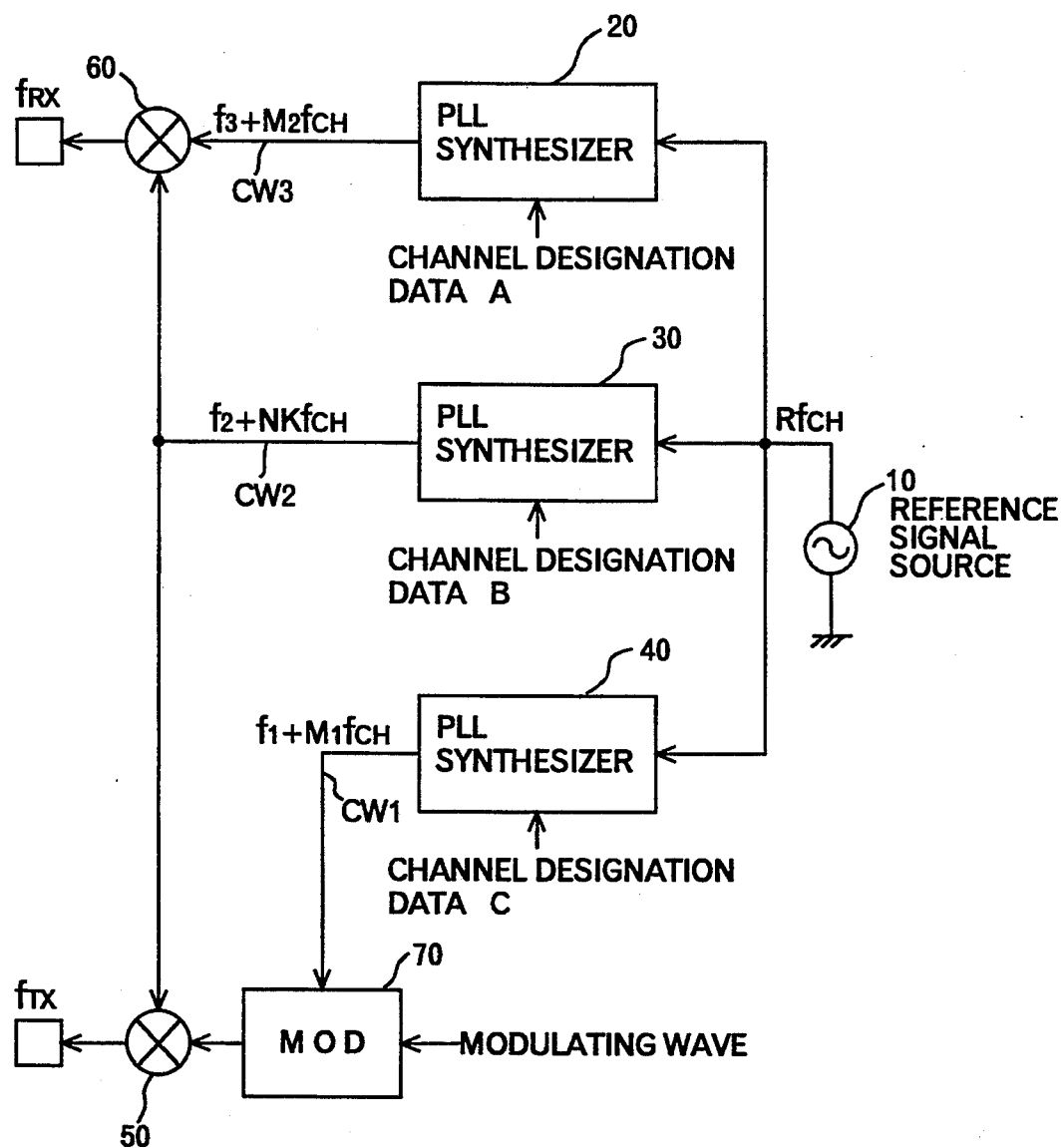
FIG. 3 is a schematic block diagram showing an example of a frequency generation part of a digital radio telephone apparatus employing the first embodiment shown in FIG. 2.

FIG. 3 shows a frequency generation part of digital radio telephone equipment employing the frequency synthesizer of FIG. 2.

First, the generation of a transmission wave frequency $f_{TX}$ will be described herein below. The PLL synthesizer 40 outputs the signal CW1 of a frequency $f_1 + M_1 f_{CH}$ corresponding to a channel frequency based on channel designation data C. A modulator 70 modulates the signal CW1 input from the PLL synthesizer 40 according to the modulating wave which is correspondent to transmission data such as sound or voice.

The PLL synthesizer 30 outputs the signal CW2 of a frequency $f_2 + N \cdot K \cdot f_{ch}$ corresponding to a channel frequency based on channel designation data B.

The mixer 50 mixes the output signal CW2 of the PLL synthesizer 30 with the output signal of the modulator 70 to output the transmission wave of a frequency $f_{TX}$ which is represented as follows:

$$f_{TX} = f_1 + f_2 + (M_1 + N \cdot K) \cdot f_{ch}.$$

A combination of the integer numbers N, K, and $M_1$ is determined by the channel designation data B and C such that the transmission wave frequency $f_{TX}$ can be obtained by combining the output signal CW1 of the PLL synthesizer 40 and the output signal of the PLL synthesizer 30.

Herein, if K is equal to $M_1$, the transmission wave frequency $f_{TX}$ can be expressed by the following equation:

$$f_{TX} = f_1 + f_2 + (1+N)M_1 f_{CH}$$

Thus, the frequency $f_{TX}$ can be also varied in units of the channel step frequency. In this way, the PLL synthesizer 40 can phase-lock a frequency lower than that as in the case of PLL synthesizer 2 of FIG. 1 and, therefore, phase-lock time in the PLL synthesizer 40 can be shortened.

Further, in the PLL synthesizer 30 the frequency for phase comparison becomes K times (K=$M_1$) as large as the channel step frequency. Therefore, the time constant of a loop filter forming the phase lock loop can be decreased and phase-lock time in the PLL synthesizer 30 can be also reduced. As a result, the phase-lock time of the transmission wave can be decreased.

Furthermore, since the modulated signal source 3 as shown in FIG. 1 is not required for the modulator 70, a circuit can be desirably simplified.

Now, generation of a local frequency $f_{RX}$ will be described below. The PLL synthesizer 20 outputs the signal CW3 of a frequency $f_3 + M_2 f_{CH}$ corresponding to a channel frequency based on the channel designation data A.

The mixer 60 mixes the output signal CW2 of the PLL synthesizer 30 with the output signal CW3 of the PLL synthesizer 20 to output the local signal $CW_R$ for receiving of a frequency $f_{RX}$ represented by the following expression:

$$f_{RX} = f_2 + f_3 + (M_2 + NK)f_{CH}.$$

A combination of the integer numbers N, K, and $M_2$ is determined by the channel designation data A and B such that the receiving frequency $f_{RX}$ can be obtained by combining the output signal CW2 of the PLL synthesizer 30 and the output signal CW3 of the PLL synthesizer 20.

Since in the PLL synthesizer 20 a frequency for phase comparison can be $M_2$ times as large as the channel step frequency, the time constant of a loop filter constituting a phase lock loop can be decreased and the phase-lock time in the PLL synthesizer 20 can be also shortened, which preferably contributes to the decrease of the phase-lock time of the receiving local frequency $f_{RX}$.

Figure 4:
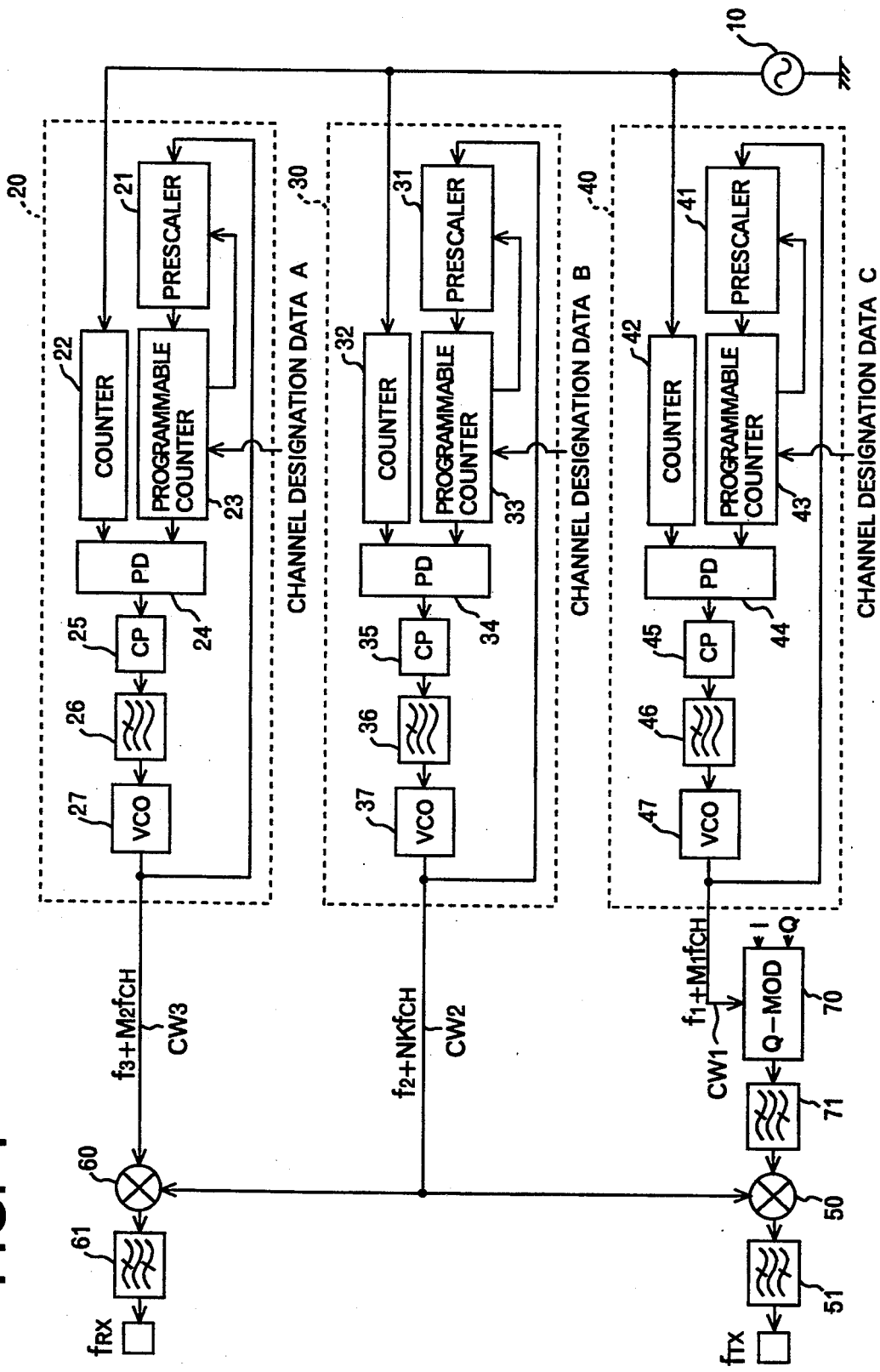
FIG. 4 is a detailed block diagram of the frequency generation part shown in FIG. 3.

FIG. 4 shows the frequency generation part in digital radio telephone equipment employing the frequency synthesizer of FIG. 3.

The PLL synthesizer 20 is comprised of a counter 22 for frequency-dividing the reference signal of the reference signal source 10 to obtain a channel step frequency $f_{CH}$, a prescaler 21 for frequency-dividing the output signal of a voltage control oscillation circuit 27 in accordance with a control signal of a programmable counter 23, the programmable counter 23 for, controlling the prescaler 21 to frequency-divide based on the channel designation data A and, frequency-dividing the output signal of the prescaler 21, a phase comparison circuit 24 for comparing the phase of the output signal of the counter 22 with that of the output signal of the programmable counter 23 to output the comparison result to a charge pump circuit 25, the charge pump circuit 25 for converting the amount of lead/lag of the phase into voltage based on the output of the phase comparison circuit 24, a low-pass filter 26 for removing voltage components other than DC component from the output voltage of the charge pump circuit 25, and the voltage control oscillation circuit 27 for outputting the signal of a frequency corresponding to the output voltage of the low-pass filter 26. The voltage control oscillation circuit 27 outputs a signal of a frequency $f_3 + M_2 f_{CH}$.

The PLL synthesizer 30 is comprised of a counter 32 for frequency-dividing the reference signal of the reference signal source 10 to obtain a channel step frequency $f_{CH}$, a prescaler 31 for frequency-dividing the output signal of a voltage control oscillation circuit 37 in accordance with a control signal of a programmable counter 33, the programmable counter 33 for, controlling the prescaler 31 to frequency-divide based on the channel designation data B and, frequency-dividing the output signal of the prescaler 31, a phase comparison circuit 34 for comparing the phase of the output signal of the counter 32 with that of the output signal of the programmable counter 33 to output the comparison result to a charge pump circuit 35, the charge pump circuit 35 for converting the amount of lead/lag of the phase into voltage based on the output of the phase comparison circuit 34, a low-pass filter 36 for removing voltage components other than DC component from the output voltage of the charge pump circuit 35, and the voltage control oscillation circuit 37 for outputting the signal of a frequency corresponding to the output voltage of the low-pass filter 36. The voltage control oscillation circuit 37 outputs a signal of a frequency $f_2 + NKf_{CH}$.

The PLL synthesizer 40 is comprised of a counter 42 for frequency-dividing the reference signal of the reference signal source 10 to obtain a channel step frequency $f_{CH}$, a prescaler 41 for frequency-dividing the output signal of a voltage control oscillation circuit 47 in accordance with a control signal of a programmable counter 43, the programmable counter 43 for, controlling the prescaler 41 to frequency-divide based on the channel designation data C and, frequency-dividing the output signal of the prescaler 41, a phase comparison circuit 44 for comparing the phase of the output signal of the counter 42 with that of the output signal of the programmable counter 43 to output the comparison result to a charge pump circuit 45, the charge pump circuit 45 for converting the amount of lead/lag of the phase into voltage based on the output of the phase comparison circuit 44, a low-pass filter 46 for removing voltage components other than DC component from the output voltage of the charge pump circuit 45, and the voltage control oscillation circuit 47 for outputting the signal of a frequency corresponding to the output voltage of the low-pass filter 46. The voltage control oscillation circuit 47 outputs a signal of a frequency $f_1 + M_1 f_{CH}$.

A quadrature modulator 70 modulates an output signal of the voltage control oscillation circuit 47 by using a modulating signal comprising I and Q signals. The output of the quadrature modulator 70 is input to the mixer 50 through a band-pass filter 71 for removing components other than the frequency components of the modulated signal and the modulating signal. The output signal of the voltage control oscillation circuit 37 is also input to the mixer 50 in which the output signal of the voltage control oscillation circuit 37 is mixed with the output signal of the band-pass filter 71. The output signal of the mixer 50 becomes the transmission wave of a frequency $f_{TX}$ via a band-pass filter 51 for removing unnecessary frequency components.

The mixer 60 mixes the output signal of the voltage control oscillation circuit 27 with the output signal of the voltage control oscillation circuit 37. The mixture becomes a receiving local frequency $f_{RX}$ via a band-pass filter 61 for removing unnecessary frequency components.

Figure 5:
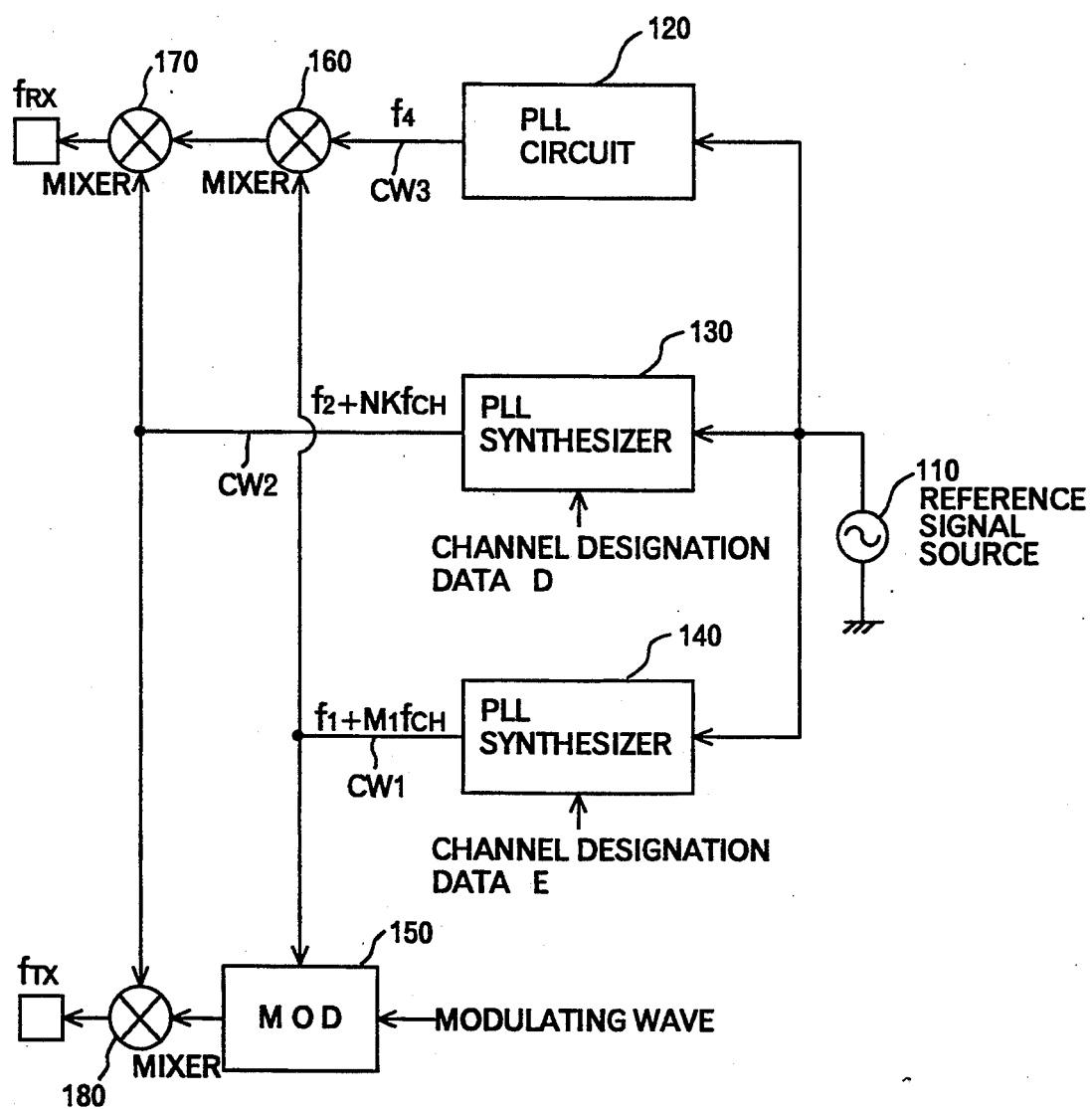
FIG. 5 is a schematic block diagram showing an example of a frequency generation part of a digital radio telephone apparatus employing a second embodiment of the present invention.

FIG. 5 shows a frequency generation part of digital radio telephone equipment employing a second embodiment of the invention. The present embodiment is employed in digital radio telephone equipment in which the difference between a transmission wave frequency $f_{TX}$ and a receiving wave frequency $f_{RX}$ for each channel is equal in all channels. In other words, the present invention may be applied to a system in which the difference between the transmission wave frequency and the receiving wave frequency is equal throughout all channels in such a way that, for example, the transmission wave frequency of channel No. 0 is 810 MHz and the receiving wave frequency thereof is 940 MHz and the difference therebetween is 130 MHz, or the transmission wave frequency of channel No. 1 is 810.025 MHz and the receiving wave frequency is 940.025 MHz and the difference therebetween is 130 MHz.

Initially, the formation of a transmission wave frequency $f_{TX}$ will be described herein below. Referring to FIG. 5, a PLL synthesizer 140 outputs the signal CW1 of a frequency $f_1 + M f_{CH}$ corresponding to a channel frequency based on the channel designation data E. A modulator 150 modulates the signal CW1 input from the PLL synthesizer 140 according to the modulating wave.

The PLL synthesizer 130 outputs the signal CW2 of a frequency $f_2 + N \cdot K \cdot f_{ch}$ corresponding to a channel frequency based on the channel designation data D.

The mixer 180 mixes the output signal CW2 of the PLL synthesizer 130 with the output signal of the modulator 150 to output the transmission wave of a frequency $f_{TX}$ which is represented as follows:

$$f_{TX} = f_1 + f_2 + (M + N \cdot K) \cdot f_{ch}.$$

A combination of the integer numbers N, K, and M is determined by the channel designation data D and E such that the transmission wave frequency $f_{TX}$ can be obtained by combining the output signal CW1 of the PLL synthesizer 140 and the output signal CW2 of the PLL synthesizer 130.

Herein, if K is equal to M, the transmission wave frequency $f_{TX}$ can be expressed by the following equation:

$$f_{TX} = f_1 + f_2 + (1+N) M f_{CH}$$

Thus, the frequency $f_{TX}$ can be also varied in units of the channel step frequency. In this way, the PLL synthesizer 140 can phase-lock a frequency lower than that as in the case of PLL synthesizer 2 of FIG. 1 and, therefore, phase-lock time in the PLL synthesizer 140 can be shortened.

Further, in the PLL synthesizer 130 the frequency for phase comparison becomes K times (K=M) as large as the channel step frequency. Therefore, the time constant of a loop filter forming the phase lock loop can be decreased and phase-lock time in the PLL synthesizer 130 can be also reduced. As a result, the phase-lock time of the transmission wave can be decreased.

Furthermore, since the modulated signal source 3 as shown in FIG. 1 is not required for the modulator 150, a circuit can be desirably simplified.

Now, generation of a local frequency $f_{RX}$ will be described below. The PLL synthesizer 120 outputs the signal CW3 of a fixed frequency $f_4$.

The mixer 160 mixes the output signal CW1 of the PLL synthesizer 140 with the output signal CW3 of the PLL synthesizer 120 to output the signal of a frequency, $f_1 + f_4 + M f_{CH}$. Further, the mixer 170 mixes the output signal of the mixer 160 with the output signal CW2 of the PLL synthesizer 130 to output the signal for receiving of a frequency $f_{RX}$ represented by the following expression:

$$f_{RX} = f_1 + f_2 + f_4 + (M+NK)f_{CH},$$

where $f_1 + f_2 + f_4$ is equal to the minimum frequency of the receiving frequency range.

As described above, a combination of the integer numbers N, K, and M is determined by the channel designation data D and E such that the transmission and receiving frequencies, $f_{TX}$ and $f_{RX}$, each varying in units of the frequency step, can be obtained.

Figure 6:
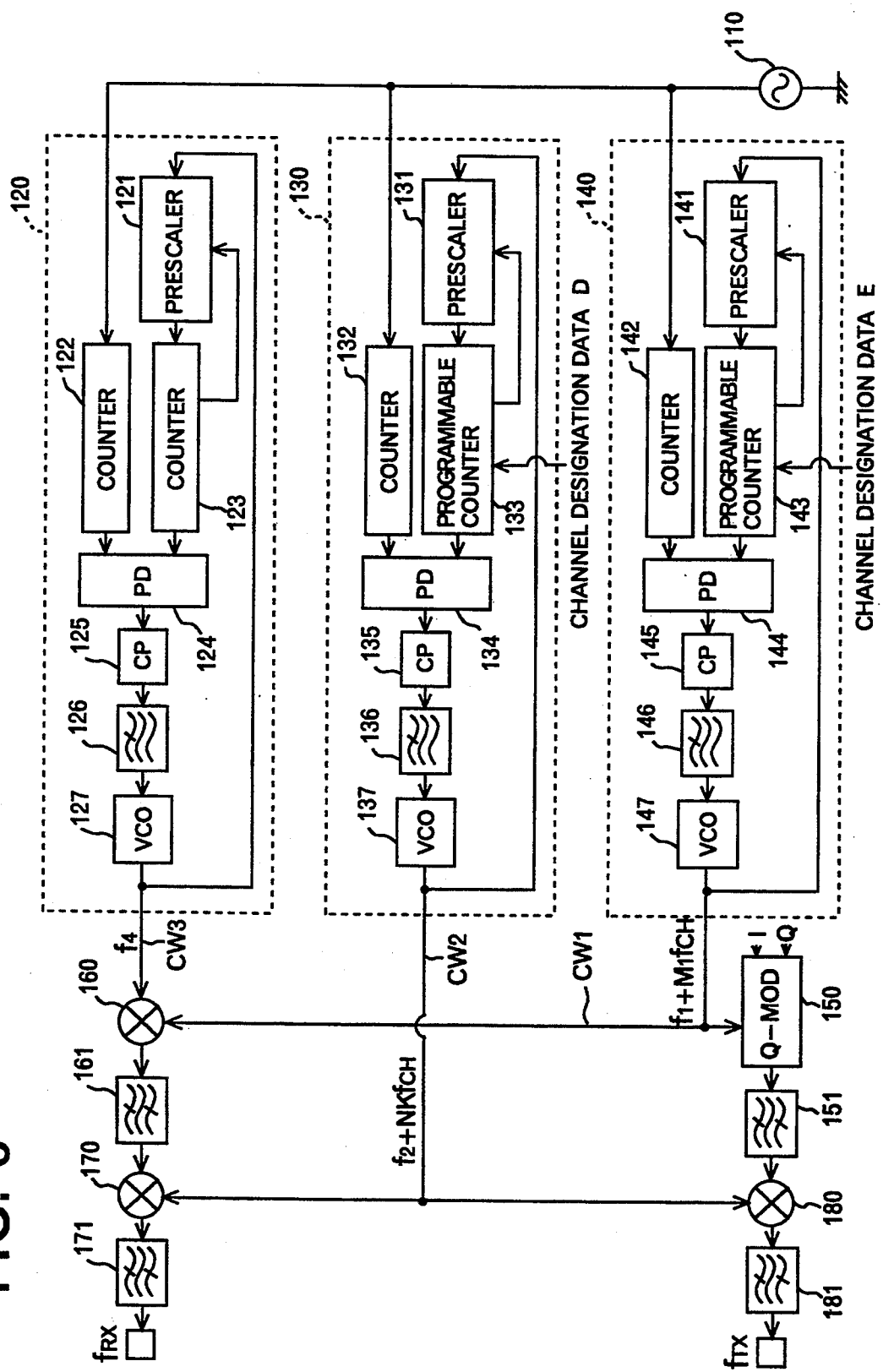
FIG. 6 is a detailed block diagram of the frequency generation part shown in FIG. 5.

FIG. 6 shows the frequency generation part in digital radio telephone equipment employing the frequency synthesizer of FIG. 5.

The PLL synthesizer 120 is comprised of a counter 122 for frequency-dividing the reference signal of the reference signal source 110 to obtain a channel step frequency $f_{CH}$, a prescaler 121 for frequency-dividing the output signal of a voltage control oscillation circuit 127 in accordance with a control signal of a counter 123, the counter 123 for, controlling the prescaler 121 to frequency-divide and, frequency-dividing the output signal of the prescaler 121, a phase comparison circuit 124 for comparing the phase of the output signal of the counter 122 with that of the output signal of the counter 123 to output the comparison result to a charge pump circuit 125, the charge pump circuit 125 for converting the amount of lead/lag of the phase into voltage based on the output of the phase comparison circuit 124, a low-pass filter 126 for removing voltage components other than DC component from the output voltage of the charge pump circuit 125, and the voltage control oscillation circuit 127 for outputting the signal of a frequency corresponding to the output voltage of the low-pass filter 126. The voltage control oscillation circuit 127 outputs the signal CW3 of a fixed frequency $f_4$.

The PLL synthesizer 130 is comprised of a counter 132 for frequency-dividing the reference signal of the reference signal source 110 to obtain a channel step frequency $f_{CH}$, a prescaler 131 for frequency-dividing the output signal of a voltage control oscillation circuit 137 in accordance with a control signal of a programmable counter 133, the programmable counter 133 for, controlling the prescaler 131 to frequency-divide based on the channel designation data D and, frequency-dividing the output signal of the prescaler 131, a phase comparison circuit 134 for comparing the phase of the output signal of the counter 132 with that of the output signal of the programmable counter 133 to output the comparison result to a charge pump circuit 135, the charge pump circuit 135 for converting the amount of lead/lag of the phase into voltage based on the output of the phase comparison circuit 134, a low-pass filter 136 for removing voltage components other than DC component from the output voltage of the charge pump circuit 135, and the voltage control oscillation circuit 137 for outputting the signal of a frequency corresponding to the output voltage of the low-pass filter 136. The voltage control oscillation circuit 137 outputs a signal of a frequency $f_2 + NKf_{CH}$.

The PLL synthesizer 140 is comprised of a counter 142 for frequency-dividing the reference signal of the reference signal source 110 to obtain a channel step frequency $f_{CH}$, a prescaler 141 for frequency-dividing the output signal of a voltage control oscillation circuit 147 in accordance with a control signal of a programmable counter 143, the programmable counter 143 for, controlling the prescaler 141 to frequency-divide based on the channel designation data E and, frequency-dividing the output signal of the prescaler 141, a phase comparison circuit 144 for comparing the phase of the output signal of the counter 142 with that of the output signal of the programmable counter 143 to output the comparison result to a charge pump circuit 145, the charge pump circuit 145 for converting the amount of lead/lag of the phase into voltage based on the output of the phase comparison circuit 144, a low-pass filter 146 for removing voltage components other than DC component from the output voltage of the charge pump circuit 145, and the voltage control oscillation circuit 147 for outputting the signal of a frequency corresponding to the output voltage of the low-pass filter 146. The voltage control oscillation circuit 147 outputs a signal of a frequency $f_1 + Mf_{CH}$.

A quadrature modulator 150 modulates an output signal CW1 of the voltage control oscillation circuit 147 by using a modulating signal comprising I and Q signals. The output of the quadrature modulator 150 is input to the mixer 180 through a band-pass filter 151 for removing components other than the frequency components of the modulated signal and the modulating signal. The output signal of the voltage control oscillation circuit 137 is also input to the mixer 180 in which the output signal CW2 of the voltage control oscillation circuit 137 is mixed with the output signal of the band-pass filter 151. The output signal of the mixer 180 becomes the transmission wave of a frequency $f_{TX}$ via a band-pass filter 181 for removing unnecessary frequency components.

The mixer 160 mixes the output signal CW3 of the voltage control oscillation circuit 127 with the output signal CW1 of the voltage control oscillation circuit 147. The output signal of the mixer 160 is input to the mixer 170 through a band-pass filter 161 for removing unnecessary frequency components. The mixer 170 mixes the output of the band-pass filter 161 with the output signal CW2 of the voltage control oscillation circuit 137. The output signal of the mixer 170 becomes a receiving local frequency $f_{RX}$ via a band-pass filter 171 for removing unnecessary frequency components.

In any embodiment described above, one reference signal source 10 or 110 is employed. However, it is generally considered that the present invention is not limited thereto, the respective PLL synthesizers are provided with a reference signal source.

Figure 7:
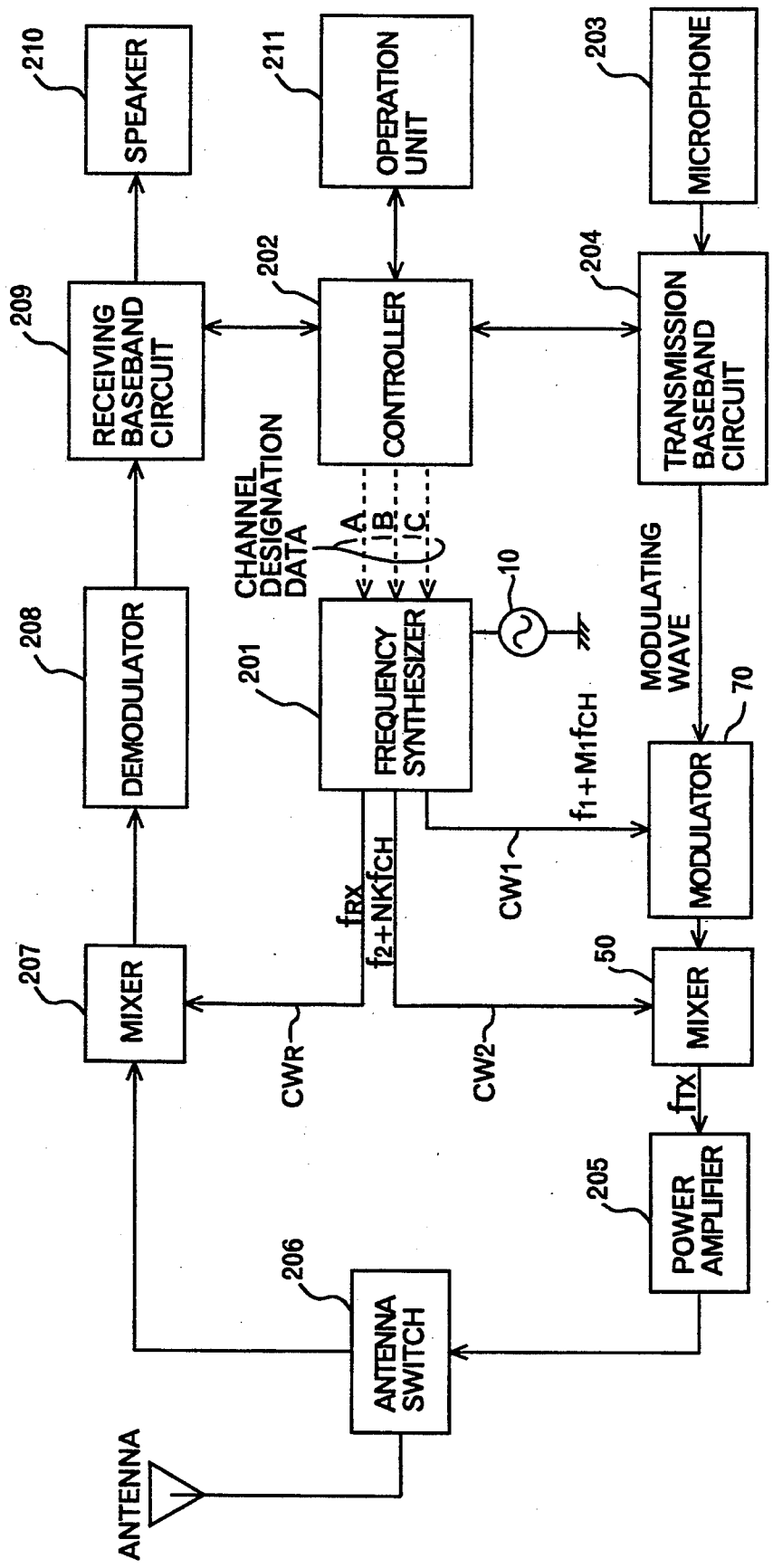
FIG. 7 is a schematic block diagram showing a circuit configuration of a digital radio telephone apparatus employing the frequency generation part illustrated in FIGS. 3 and 4.

Now, referring to FIG. 7, an example of radio telephone equipment employing the frequency synthesizer according to the first embodiment of the present invention shown in FIGS. 3 and 4 will be described below. The frequency synthesizer 201 according to the present embodiment generates the receiving output signal $CW_R$ of a receiving local frequency $f_{RX}$ and signals CW1 and CW2 for forming a transmission wave of a frequency $f_{TX}$ in accordance with the channel designation data A, B, and C input from a controller 202.

A sound or voice signal output from a microphone 203 is input to the modulator 70 as a modulating wave through a transmission baseband circuit 204. The modulator 70 is a quadrature modulator such as a $\pi/4$ shift QPSK modulator which is used in a portable digital telephone. The signal CW1 of a frequency $f_1 + M_1 f_{CH}$ output from the frequency synthesizer 201 is modulated by the modulating wave in the modulator 70. The frequency of the modulated signal is further added to the frequency of the signal CW2 of a frequency $f_2 + NKf_{CH}$ by a mixer 50 to generate a transmission wave of a frequency $f_{TX}$. This transmission wave is amplified by a power amplifier 205 to be transmitted through an antenna switch 206.

A receiving wave is input to a mixer 207 through the antenna switch 206. The mixer 207 mixes the receiving local frequency $f_{RX}$ of a signal $CW_R$ output from the frequency synthesizer 201 with the receiving wave and converts the receiving wave into an intermediate frequency band. A demodulator 208 detects the sound signal from the receiving wave and the sound signal is reproduced by a speaker 210 through a receiving baseband circuit 209. An operation unit 211 is comprised of dialing keys and a display.

For mobile communication apparatuses such as a portable telephone set and an automobile telephone set, decreasing the amount of hardware and saving power are extremely important. Therefore, a frequency synthesizer according to the present invention is suitable for such applications.

Further, as discussed above, the frequency synthesizer according to the present invention is provided with a plurality of PLL synthesizers, one PLL synthesizer generating a lower frequency and the other having a higher comparison frequency of the PLL. The output signals of the PLL synthesizers are mixed to generate a transmission or receiving output frequency. Therefore, the output frequency can be switched at high speed. When a frequency synthesizer of the invention is applied to the frequency synthesizer of radio telephone equipment, a transmission wave frequency $f_{TX}$ and receiving local frequency $f_{RX}$ can be similarly switched at high speed. Further, a simple circuit configuration can be realized so that power consumption can be reduced.

A time division multiple access (TDMA) system may be generally employed in digital radio telephone equipment. According to the present invention, a channel can be switched at high speed and, therefore, the present invention may be very effective in the case of burst transmitting and receiving as in the TDMA system.

I claim:

1. A frequency synthesizer comprising:
   first subfrequency generating means for generating a first signal of a first subfrequency, said first subfrequency being capable of varying in units of a predetermined frequency step according to a first subfrequency control signal;
   second subfrequency generating means for generating a second signal of a second subfrequency, said second subfrequency being capable of varying in units of a frequency step being N (integer; $N >= 2$) times said predetermined frequency step according to a second subfrequency control signal;
   third subfrequency generating means for generating a third signal of a third subfrequency, said third subfrequency being capable of varying in units of said predetermined frequency step according to a third subfrequency control signal;
   output means for generating two output signals of different frequencies belonging to two different frequency ranges, respectively, by using two combinations selected from the combinations of said first signal, said second signal and said third signal.

2. The synthesizer as set forth in claim 1, wherein said output means comprises:
   first combining means for combining said first signal and said second signal to form a first output signal, a frequency of said first output signal being selected from a plurality of frequencies according to said first and second subfrequency control signals, said plurality of frequencies having said predetermined frequency steps over a first frequency range; and
   second combining means for combining said second signal and said third signal to form a second output signal, a frequency of said second output signal being selected from a plurality of frequencies according to said second and third subfrequency control signals, said plurality of frequencies having said predetermined frequency steps over a second frequency range different from said first frequency range.

3. The synthesizer as set forth in claim 1, wherein one of said first, second and third subfrequencies is constant, and
   said output means comprises: first combining means for combining two signals other than said constant subfrequency signal to form one output signal; and second combining means for combining all of said first, second and third subfrequencies to form the other output signal.

4. The synthesizer as set forth in claim 1, wherein
   said first subfrequency comprises: a first minimum frequency of said first subfrequency generating means; and a first variable frequency varying in units of said predetermined frequency step;
   said second subfrequency comprises: a second minimum frequency of said second subfrequency generating means; and a second variable frequency varying in units of said frequency step being N times said predetermined frequency step, said first minimum frequency and said second minimum frequency being added to make a minimum frequency of said first frequency range, said first variable frequency and said second variable frequency being added to make said predetermined frequency steps according to said first and second subfrequency control signals;
   said third subfrequency comprises: a third minimum frequency of said third subfrequency generating means; and a third variable frequency varying in units of said predetermined frequency step, said second minimum frequency and said third minimum frequency being added to make a minimum frequency of said second frequency range, said second variable frequency and said third variable frequency being added to make said predetermined frequency steps according to said second and third subfrequency control signals.

5. A frequency synthesizer comprising:
   first subfrequency generating means for generating a first signal of a first subfrequency, said first subfrequency being capable of varying in units of a predetermined frequency step according to a first subfrequency control signal;
   second subfrequency generating means for generating a second signal of a second subfrequency, said second subfrequency being capable of varying in units of a frequency step being N times said predetermined frequency step according to a second subfrequency control signal;
   third subfrequency generating means for generating a third signal of a predetermined subfrequency;
   first combining means for combining said first signal and said second signal to form a first output signal, a frequency of said first output signal being selected from a plurality of frequencies according to said first and second subfrequency control signals, said plurality of frequencies having said predetermined frequency steps over a first frequency range; and second combining means for combining said first signal, said second signal and said third signal to form a second output signal, a frequency of said second output signal being selected from a plurality of frequencies according to said first and second subfrequency control signals, said plurality of frequencies having said predetermined frequency steps over a second frequency range different from said first frequency range.

6. The synthesizer as set forth in claim 5, wherein said first subfrequency comprises: a first minimum frequency of said first subfrequency generating means; and a first variable frequency varying in units of said predetermined frequency step; and said second subfrequency comprises: a second minimum frequency of said second subfrequency generating means; and a second variable frequency varying in units of said frequency step being N times said predetermined frequency step, said first minimum frequency and said second minimum frequency being added to make a minimum frequency of said first frequency range, said first minimum frequency, said second minimum frequency and said third frequency being added to make a minimum frequency of said second frequency range, and said first variable frequency and said second variable frequency being added to make said predetermined frequency steps according to said first and second subfrequency control signals.

7. A frequency synthesizer comprising:

first generating means for generating a first output signal of a frequency selected from a plurality of frequencies with a first frequency step in a first frequency range, said first generating means comprising:

a) first subfrequency generating means for generating a first signal of a first subfrequency, said first subfrequency being capable of varying in units of said first frequency step according to a first subfrequency control signal;

b) second subfrequency generating means for generating a second signal of a second subfrequency, said second subfrequency being capable of varying in units of a second frequency step being N times said first frequency step according to a second subfrequency control signal; and c) first combining means for combining said first and second signals to form said first output signal according to said first and second subfrequency control signals; and second generating means for generating a second output signal of a frequency selected from a plurality of frequencies with said first frequency step in a second frequency range, said second generating means comprising:

d) third subfrequency generating means for generating a third signal of a third subfrequency, said third subfrequency being capable of varying in units of said first frequency step according to a third subfrequency control signal; and e) second combining means for combining said second signal and said third signal to form said second output signal according to said second and third subfrequency control signals.

8. The synthesizer as set forth in claim 7, wherein said first subfrequency comprises: a first minimum frequency of said first subfrequency generating means; and a first variable frequency varying in units of said first frequency step;

said second subfrequency comprises: a second minimum frequency of said second subfrequency generating means; and a second variable frequency varying in units of said frequency step being N times said first frequency step, said first minimum frequency and said second minimum frequency being added to make a minimum frequency of said first frequency range, said first variable frequency and said second variable frequency being added to make said first frequency steps according to said first and second subfrequency control signals;

said third subfrequency comprises: a third minimum frequency of said third subfrequency generating means; and a third variable frequency varying in units of said first frequency step, said second minimum frequency and said third minimum frequency being added to make a minimum frequency of said second frequency range, said second variable frequency and said third variable frequency being added to make said first frequency steps according to said second and third subfrequency control signals.

* * * * *